(12) United States Patent
Hsu

(10) Patent No.: US 7,387,523 B2
(45) Date of Patent: Jun. 17, 2008

(54) LAND GRID ARRAY CONNECTOR WITH COVER MEMBER

(75) Inventor: Hsiu-Yuan Hsu, Tu-Cheng (TW)

(73) Assignee: Hon Hai Precision Ind. Co., Ltd, Taipei Hsien (TW)

( * ) Notice: Subject to any disclaimer, the term of this patent is extended or adjusted under 35 U.S.C. 154(b) by 0 days.

(21) Appl. No.: 11/647,028

(22) Filed: Dec. 27, 2006

(65) Prior Publication Data

US 2007/0155215 A1 Jul. 5, 2007

(30) Foreign Application Priority Data

Dec. 29, 2005 (CN) .................. 2005 1 0097349

(51) Int. Cl.
*H01R 13/62* (2006.01)

(52) U.S. Cl. .......................... 439/331; 439/73

(58) Field of Classification Search ................ 439/331, 439/330, 342, 525, 526, 73

See application file for complete search history.

(56) References Cited

U.S. PATENT DOCUMENTS

| 4,502,747 | A | * | 3/1985 | Bright et al. | ................ | 439/296 |
|---|---|---|---|---|---|---|
| 4,560,217 | A | * | 12/1985 | Siano | .......................... | 439/68 |
| 5,009,608 | A | * | 4/1991 | Shipe | .......................... | 439/331 |
| 5,387,120 | A | * | 2/1995 | Marks et al. | ................ | 439/331 |
| 6,692,279 | B1 | * | 2/2004 | Ma | .............................. | 439/331 |
| 6,776,642 | B1 | * | 8/2004 | McHugh et al. | ............ | 439/331 |
| 7,182,619 | B2 | * | 2/2007 | Hsu | .......................... | 439/331 |
| 7,182,620 | B1 | * | 2/2007 | Ju | .............................. | 439/331 |

* cited by examiner

*Primary Examiner*—Hien Vu
(74) *Attorney, Agent, or Firm*—Wei Te Chung

(57) ABSTRACT

An LGA electrical connector (100) includes an insulative housing (2) for receiving an LGA package (7), a stiffener (3) for grasping a periphery of the housing, a first cover member (4) attached to a front end of the stiffener, a second cover member (5) and a lever (6) respectively attached to opposite ends of the stiffener. The first cover member is adapted for engaging a top surface of the LGA package, while the second cover member is rotatable to rest upon the first cover member and locked at its free end by the lever. With the first and second cover members attached to opposite sides of the LGA connector, the LGA package will be disposed in a parallel relationship with respect to the top surface of the housing when the cover members are rotated upon the LGA package.

8 Claims, 3 Drawing Sheets

LAND GRID ARRAY CONNECTOR WITH COVER MEMBER

BACKGROUND OF THE INVENTION

1. Field of the Invention

The present invention relates to the art of electrical connectors, and more particularly to a land grid array (LGA) connector with cover members for holding a circuit board, such as an IC chip, on the LGA connector.

2. General Background

Various types of connectors have been developed for electrical connections to an IC package and a printed circuit board, such as Pin Grid Array (PGA) connectors, Ball Grid Array (BGA) connectors, Land Grid Array (LGA) connectors.

As shown in FIG. 3, one type of conventional LGA connector 100' includes an insulative housing 8' for receiving an LGA package 3', a stiffener 4' attached to the insulative housing 8' for surrounding at least part of the insualive housing 8', a cover member 5' and a lever 6' respectively attached to opposite ends of the stiffener 4' so as to cooperatively hold the LGA package 3' of the insulative housing 8' in position. In addition, a frame 7' is disposed upon a top surface of the LGA package 3' and below the cover member 5' for at least partially absorbing a force imparted on the LGA package 3' of the insulative housing 8' when the cover member 5' is urged to be pressed upon the LGA package 3' of the insualtive housing 8' and further held in a closed position by the lever 6'.

A problem, however, with such an LGA connector 100' is that the LGA package 3' is prone to be tilted toward the attached end of the cover member 5' with respect to a top surface of the insulative housing 8'. This is so because force imparted on a part of the LGA package 3' adjacent the cover member 5' attached end is generally larger than that of an opposite part of the LGA package 3' adjacent the lever 6' attached end, due to having the frame 7' merely placed on the top surface of the LGA package 3' while not attached to any portion of the LGA connector 100', such as to the insulative housing 8' or the stiffener. The tilting of the LGA package 3' on the insualtive housing 8' will result in the electrical connector failure between the LGA package 3' and the LGA connector 100'.

SUMMARY OF THE INVENTION

An LGA electrical connector according to an embodiment of the present invention includes an insulative housing having a plurality of contacts, a stiffener, a first cover member, a second cover member and a lever. The insulative housing has a top surface for receiving an LGA package. The stiffener defines an opening for grasping a peripheral edge of the insulative housing. The first cover member is pivotally attached to a front end of the insulative housing, and adapted to be rotated towards the top surface of the insulative housing and for engaging with the LGA package on the insulative housing. The second cover member is pivotally attached to a rear end of the stiffener opposite to the attached end of said first cover member so as to be rotated upon the first cover member. The lever is pivotally attached to an opposite front end of the stiffener, and adapted for locking the second cover member at a free end of the second cover member opposite to the attached end of the second cover member so as to cooperate with the cover members to hold the LGA package on the insulative housing.

Since the first cover member is fixably attached to one side of the LGA connector, such as the front end of the insulative housing, and the second cover member is attached to an opposite side of the LGA connector, such as the rear end of the stiffener, force from the opposite sides of the LGA connector due to the attachments of the first cover member and the second cover member to the LGA connector, is evenly exerted on the top surface of the LGA package. As compared with the prior art, with such an even force exerted on the LGA package of the LGA connector, the whole LGA package will be disposed in a parallel relationship with respect to the top surface of the insulative housing. Thus, a reliable electrical connection between the LGA package and the LGA connector will be achieved.

Other features and advantages of the present invention will become more apparent to those skilled in the art upon examination of the following drawings and detailed description of preferred embodiments, in which:

DETAILED DESCRIPTION OF PREFERRED EMBODIMENT

Figure 1:
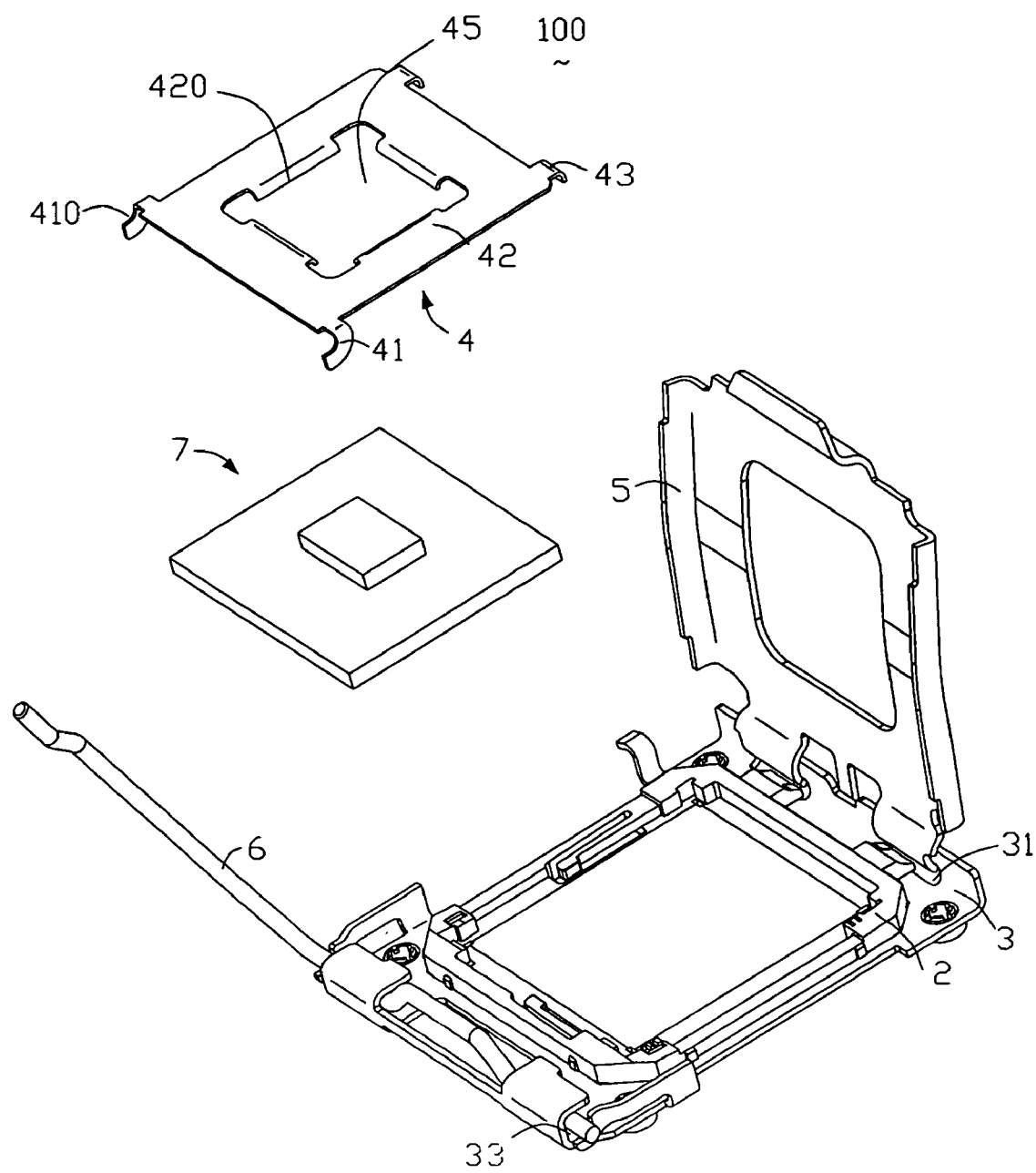
FIG. 1 is a perspective view of an LGA electrical connector according to an embodiment of the present invention, with a first cover member and an IC chip unassembled onto the LGA electrical connector.
Figure 2:
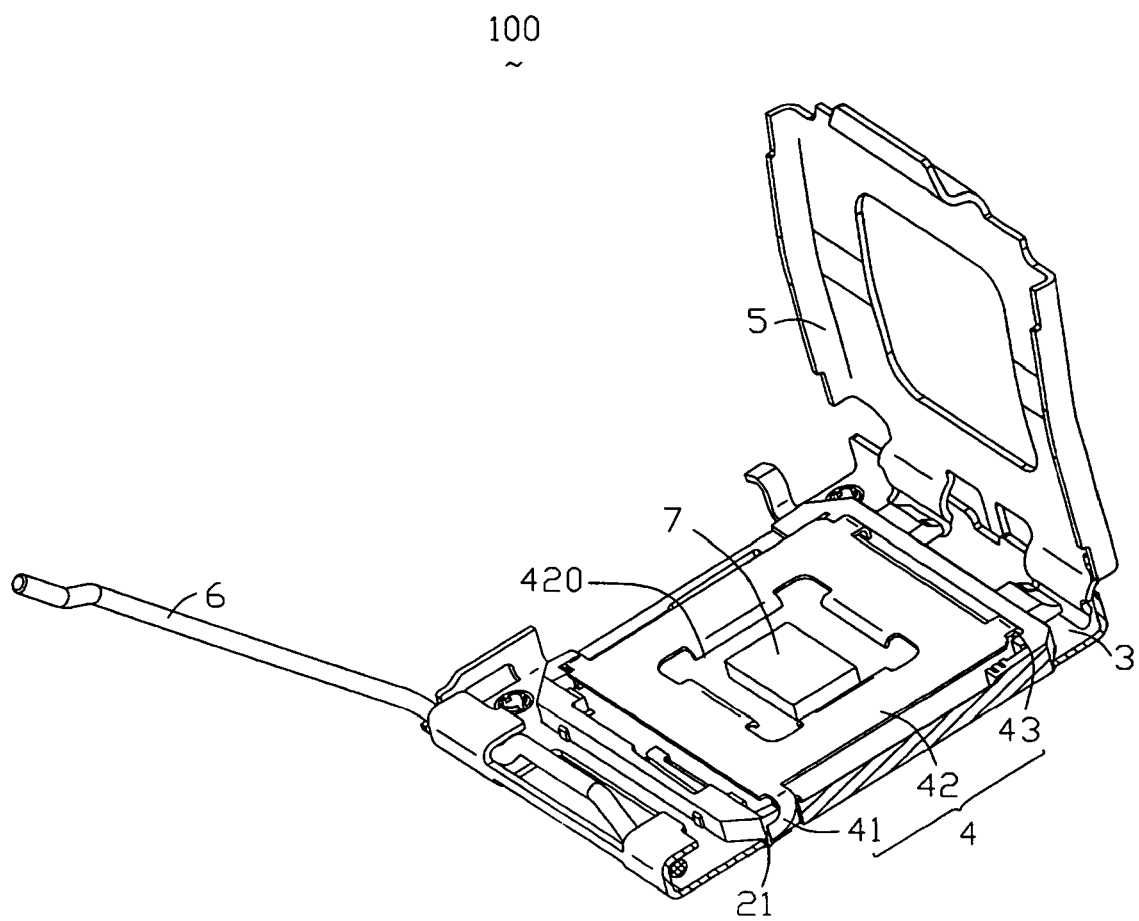
FIG. 2 is an assembled, perspective view of the LGA electrical connector of FIG. 1, with part of the insulative housing cut off to show a recess for receiving a latching element of the first cover member.
Figure 3:
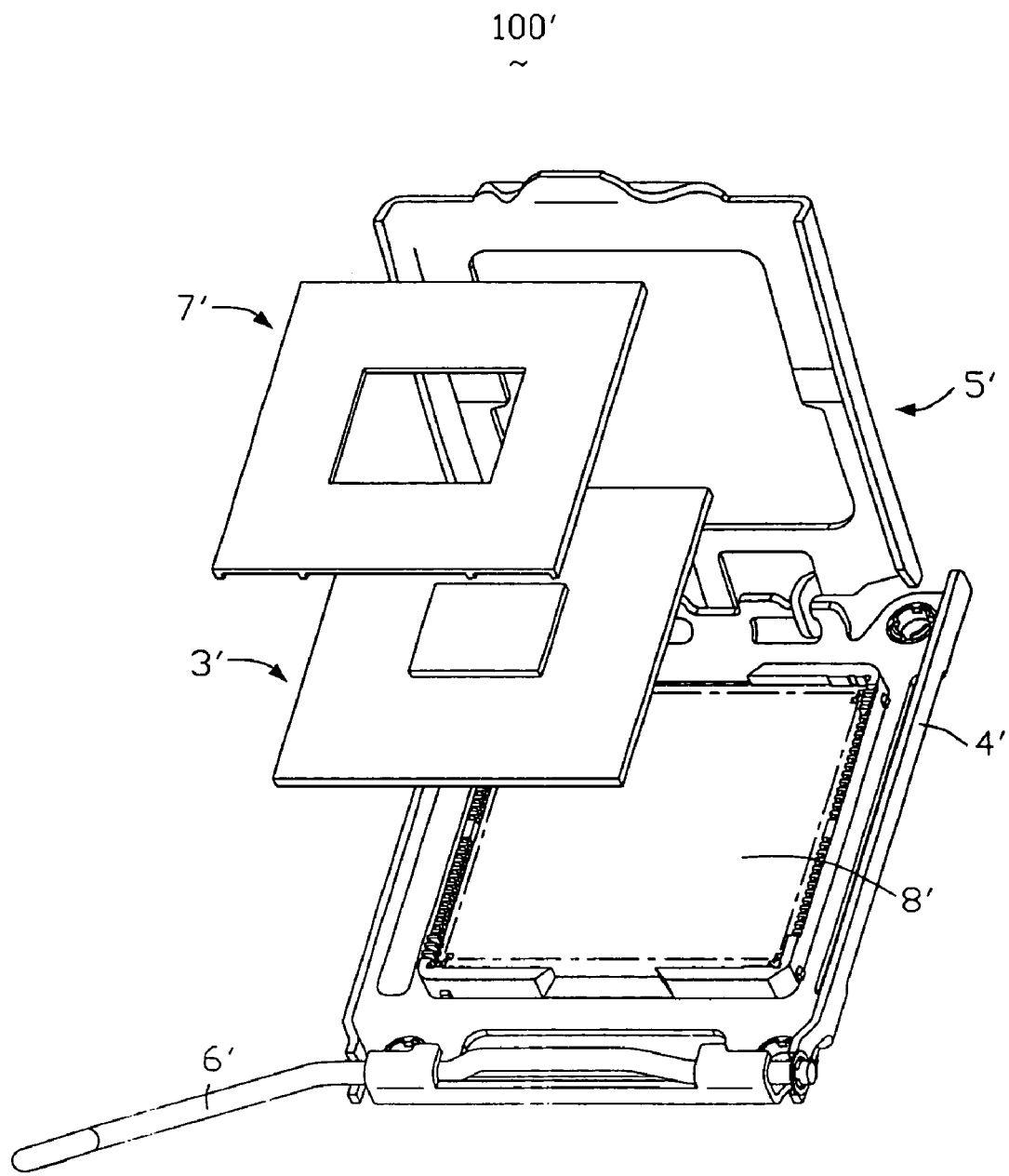
FIG. 3 is a perspective view of a conventional LGA electrical connector.

Referring to FIGS. 1 to 2, an LGA connector 100 according to the embodiment of the present invention is shown to include an insulative body or housing 2 with a plurality of contacts (not shown), a stiffener 3, a first cover member 4, a second cover member 5 and a lever 6.

The insulative housing 2 is generally of a rectangular shape, and has a top surface adapted for receiving an LGA package 7. The insulative housing 2 further includes a receptacle configured for receiving a latching member of the first cover member 4. In this embodiment, the receptacle includes a pair of mounting slots 21 located at a front end of the insulative housing 2, and adapted for receiving a pair of latching elements 41 of the first cover member 4.

The stiffener 3 is generally made of metallic material, and defines an opening for grasping a periphery edge of the insualtive housing 2. The stiffener 3 further includes respective receptacles 31, 33 at two opposite ends of the stiffener 3 for receiving the lever 6 and the second cover member 5 so as to enable the lever 6 and the second cover member 5 to be attached thereto.

The first cover member 4 is generally made of metallic material. The first cover member 4 includes four concave-convex side rails 42 extending from the first cover member 4 toward the top surface of the insulative housing 2 to form an opening 45 therebetween for receiving at least part of the LGA package 7, with free end edges 420 of the side rails 42 bearing against the LGA package 7, to be retained on the insulative housing 2. The first cover member 4 includes a latching member 41 adapted for being attached to a front end of the insulative housing 2. In this embodiment, the latching member 41 includes a pair of latching elements 410 located at opposite sides of the front end or position of the first cover member 4. Each of the latching elements 410 is preferably in a form of mounting ear, for being received in the mounting slots 21 of the insulative housing 2 so as to have the first cover member 4 be attached to the insulative housing 2 and be rotated about the front end of the insulative housing 2. In addition, the first cover member 4 includes another pair of latching catches 43 located at a rear end or position of the first cover member 4, and adapted for grasping a part of the insulative housing 2 around a rear end of the insulative housing 2. The catches 43 of the first cover member 4 are structurally different from that of the mounting ears 410 of the first cover member 4.

The second cover member 5 has portions for being received in the receptacles 31 of the stiffener 3 adjacent the rear end of the stiffener 3 so as to be pivotally attached to the rear end of the stiffener 3, and capable of being rotated upon the first cover member 4. The lever 6 has at least a part for being received in another receptacle 33 of the stiffener 3 adjacent the front end of the stiffener 3 so as to be pivotally attached to the front end of the stiffener 3. The lever 6 is adapted for locking the second cover member 5 in a closed position at a free end of the second cover member 5 opposite to the rear attached end of the second cover member 5 so as to cooperate with the first cover member 4 and the second cover member 5 to bold the LGA package 7 on the insulative housing 2.

Referring to FIGS. 1 and 2 wherein the second cover member 5 is in an open position, in assembly, the insulative housing 2, the stiffener 3, the lever 6 and the second cover member 5 are pre-assembled in a known manner. The LGA package 7 is then placed onto the top surface of the insulative housing 2. The first cover member 4 is attached to the front end of the insulative housing 2 by the mounting ears 410 of the first cover member 4 received in the corresponding mounting slots 21 of the insulative housing 2 to enable the first cover member 4 rotate about the front end of the insulative housing 2.

Referring particularly to FIG. 2, in use, the first cover member 4 is pivotably attached to the front end of the insulative housing 2 so as to be rotated towards the top surface of the LGA package 7 with free end edges 420 of the side rails 42 bearing against the top surface of the LGA package 7, and catches 43 at the rear end of the first cover member 4 for grasping the portions around the rear end of the insulative housing 2. The second cover member 5 is pivotably attached to the rear end of the stiffener 3 opposite to the front end of the insulative housing 2 to be rotated upon the first cover member 4. The lever 6 is pivotally attached to the front end of the stiffener 3 for locking the second cover member 5 at its free end of the second cover member 5 so as to cooperate with the first cover member 4 and the second cover member 5 to hold the LGA package 7 on the insulative housing 2. Since the first cover member 4 is fixably attached to one side of the LGA connector 100, such as to a front end of the insulative housing 2, and the second cover member 5 is attached to an opposite side of the LGA connector 100, such as to the rear end of the stiffener 3, force from the opposite sides of the LGA connector 100 due to the attachments of the first cover member 4 and the second cover member 5 to the LGA connector 100, is evenly exerted on the top surface of the LGA package 7. As compared with the prior art, with such an even force exerted on the LGA package 7 of the LGA connector 100, the whole LGA package 7 will be disposed in a parallel relationship with respect to the top surface of the insulative housing 2. Thus, a reliable electrical connection between the LGA package 7 and the LGA connector 100 will be achieved.

While the first cover member 4 attached to the front end of the insulative housing 2 is preferred according to this embodiment, the first cover member 4 attached to any portion of the LGA connector 100 opposite to the attachment position of the second cover member 5 can be also employed. For example, in an alternative embodiment of the present invention, the first cover member 4 is attached to the front end of the stiffener 3 but not to the insulative housing 2 as shown in this embodiment.

While the present invention has been described with reference to preferred embodiments, the description of the invention is illustrative and is not to be construed as limiting the invention. Various of modifications to the present invention can be made to preferred embodiments by those skilled in the art without departing from the true spirit and scope of the invention as defined by the appended claims.

What is claimed is:

1. A land grid array (LGA) electrical connector comprising
an insulative housing having a top surface for receiving an LGA package, and having a first and second ends thereof;
a stiffener defining an opening for abutting against a peripheral edge of the insulative housing;
a first cover member rotationally attached to a front end of the insulative housing, the first cover member adapted to be rotated towards the top surface of the insulative housing for engaging with the LGA package when disposed on the insulative housing;
a second cover member pivotally attached to a rear end of the stiffener opposite to the attached end of said first cover member and capable of pressing toward the first cover member; and
a lever pivotally attached to an opposite front end of the stiffener, the lever adapted for locking a free end of the second cover member opposite to the attached end of the second cover member so as to cooperate with the cover members to hold the LGA package on the insulative housing;
wherein said first cover member includes a latching member attached to the front end of the insulative housing;
wherein the insulative housing defines a recess for receiving the latching member;
wherein the first cover member defines plurality of free inner end edges extending downwardly for bearing against a LGA package.

2. A LGA (Land Grid Array) socket assembly comprising:
an insulative housing;
an electronic package seated upon the housing;
a metallic stiffener disposed on a peripheral region of the housing;
a first cover pivotally mounted to one end of the stiffener;
a lever pivotally mounted to the other end of the stiffener; and
a second cover seated upon the electronic package and having at least one portion engaged with the housing; wherein
said second cover is located under said first cover, and the first cover abuts downwardly against and applies forces upon said second cover being engaged with the lever, and the second cover applies the forces to the electronic package;
wherein the second cover member defines plurality of free inner end edges extending downwardly for bearing against a LGA package;

wherein a position, where said second cover is engaged with the housing is closer to said other end of the stiffener where the lever is pivotally mounted, than to said one end of the stiffener where said first cover is pivotally mounted.

3. The LGA socket assembly as claimed in claim 2, wherein said second cover is not moved when said first cover is upwardly moved to an open position.

4. The LGA socket assembly as claimed in claim 2, wherein said second cover is retainably engaged with the housing.

5. The LGA socket assembly as claimed in claim 4, wherein said second cover is pivotally moved with regard to the housing.

6. The LGA socket assembly as claimed in claim 3, wherein said second cover is moved pivotally to expose the housing thereunder after the first cover is moved to the open position.

7. The LGA socket assembly as claimed in claim 2, wherein said second cover is retainable engaged with the housing at opposite first and second positions of said second cover, and wherein the first position is closer to said other end of the stiffener and the second position is closer to said end of the stiffener.

8. The LGA socket assembly as claimed in claim 7, wherein the second cover is pivotally retainably engaged with the housing at the first position.

* * * * *